United States Patent
Ko

(10) Patent No.: US 6,979,908 B1
(45) Date of Patent: Dec. 27, 2005

(54) INPUT/OUTPUT ARCHITECTURE FOR INTEGRATED CIRCUITS WITH EFFICIENT POSITIONING OF INTEGRATED CIRCUIT ELEMENTS

(75) Inventor: U-Ming Ko, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 486 days.

(21) Appl. No.: 09/723,563

(22) Filed: Nov. 28, 2000

Related U.S. Application Data

(60) Provisional application No. 60/175,613, filed on Jan. 11, 2000.

(51) Int. Cl.$^7$ ............ H01L 29/80; H05F 3/00
(52) U.S. Cl. ........ 257/786; 257/784; 257/357; 257/691; 257/203; 257/205; 257/206; 257/207; 257/382; 257/360; 257/401; 257/377; 257/409; 257/173; 257/362; 257/384; 257/111; 257/356; 257/603; 257/372; 361/56; 361/111; 361/220; 361/91
(58) Field of Search ............ 257/786, 784, 257/357, 723, 777, 691, 203, 725, 360, 401, 257/205, 206, 209, 382, 377, 409, 173, 362, 257/405–207, 384, 635, 355, 107.111, 173.174, 257/356, 363

(56) References Cited

U.S. PATENT DOCUMENTS

| | | | |
|---|---|---|---|
| 4,750,081 A * | 6/1988 | Zhang .................... 361/220 |
| 4,825,107 A * | 4/1989 | Naganuma et al. ........ 307/465 |
| 5,017,993 A * | 5/1991 | Shibata | |
| 5,329,143 A * | 7/1994 | Chan et al. ............. 257/173 |
| 5,347,150 A * | 9/1994 | Sakai et al. ............. 257/203 |
| 5,436,183 A * | 7/1995 | Davis et al. ............. 438/200 |
| 5,714,784 A * | 2/1998 | Ker et al. ............... 257/360 |
| 5,767,551 A | 6/1998 | Smayling et al. | |
| 5,804,861 A * | 9/1998 | Leach .................... 257/362 |
| 5,838,050 A * | 11/1998 | Ker et al. ............... 257/401 |
| 6,124,143 A * | 9/2000 | Sugasawara .............. 438/18 |
| 6,147,538 A * | 11/2000 | Andresen et al. ......... 327/309 |
| 6,198,136 B1 * | 3/2001 | Voldman et al. ......... 257/357 |
| 6,303,977 B1 * | 10/2001 | Schroen et al. ......... 257/635 |
| 6,373,109 B1 * | 4/2002 | Ahn ...................... 257/384 |
| 6,388,851 B1 * | 5/2002 | Pettersson .............. 361/56 |
| 6,388,857 B1 * | 5/2002 | Sato et al. .............. 361/111 |
| 6,424,168 B1 * | 7/2002 | Farnworth et al. ....... 324/765 |
| 6,478,976 B1 * | 11/2002 | Lepert et al. ........... 216/18 |
| 6,495,442 B1 * | 12/2002 | Lin et al. ............... 438/618 |
| 6,552,594 B2 * | 4/2003 | Lin ....................... 327/310 |
| 6,566,715 B1 * | 5/2003 | Ker et al. ............... 257/355 |
| 6,593,218 B2 * | 7/2003 | Porter et al. ............ 438/527 |
| 2001/0036050 A1 * | 11/2001 | Lee at al. ............... 361/56 |
| 2002/0121668 A1 * | 9/2002 | Gossner ................. 257/360 |
| 2003/0089951 A1 * | 5/2003 | Ker et al. ............... 257/355 |

* cited by examiner

*Primary Examiner*—Alexander Oscar Williams
(74) *Attorney, Agent, or Firm*—Ronald O. Neerings; Wade James Brady, III; Frederick J. Telecky, Jr.

(57) ABSTRACT

A described embodiment of the present invention includes an integrated circuit having a plurality of I/O modules. The I/O modules include a bond pad formed on a substrate. The I/O modules also include an electrostatic discharge device formed in the substrate. The electrostatic discharge device is at least partially formed beneath the bond pad. The I/O module also includes an I/O buffer formed in the substrate. The I/O buffer is connected to the bond pad. The I/O buffer provides communication between the bond pad and circuitry formed in the substrate. The circuitry is positioned substantially adjacent to both the electrostatic discharge device and the I/O buffer.

10 Claims, 4 Drawing Sheets

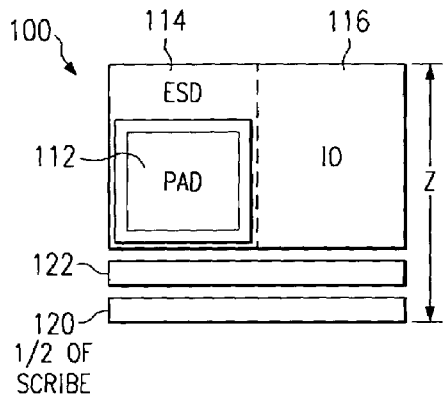
FIG. 4
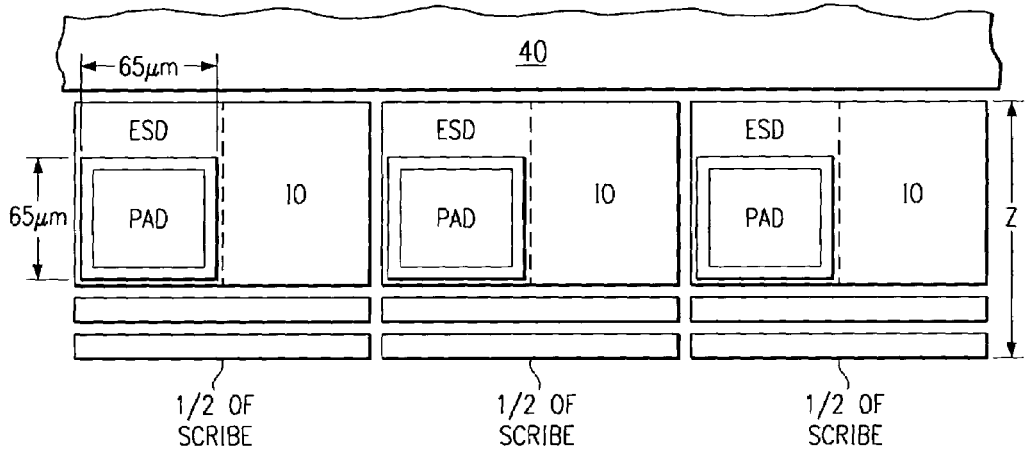
FIG. 5
FIG. 6
| CORE AREA, mm² | mm/SIDE | IO HEIGHT, μm | IO WIDTH, μm | AREA | MAX IO | WASTED AREA | % OF CORE |
|---|---|---|---|---|---|---|---|
| 10 | 3.162278 | H=188 | 75 | 12.51941 | 169 | 1.67 | 13% |
|  |  | Z=120 | 108 | 11.57549 | 117 |  |  |
| 20 | 4.472136 | H=188 | 75 | 23.50442 | 239 | 2.33 | 10% |
|  |  | Z=120 | 108 | 22.20423 | 166 |  |  |
| 30 | 5.477226 | H=188 | 75 | 34.26025 | 292 | 2.83 | 8% |
|  |  | Z=120 | 108 | 32.68667 | 203 |  |  |
| 40 | 6.324555 | H=188 | 75 | 44.89744 | 337 | 3.26 | 7% |
|  |  | Z=120 | 108 | 43.09339 | 234 |  |  |
| 50 | 7.071068 | H=188 | 75 | 55.45882 | 377 | 3.63 | 7% |
|  |  | Z=120 | 108 | 53.45171 | 262 |  |  |
| 60 | 7.745967 | H=188 | 75 | 65.96634 | 413 | 3.97 | 6% |
|  |  | Z=120 | 108 | 63.77566 | 287 |  |  |

INPUT/OUTPUT ARCHITECTURE FOR INTEGRATED CIRCUITS WITH EFFICIENT POSITIONING OF INTEGRATED CIRCUIT ELEMENTS

This application claims priority under 35 U.S.C. §119(e)(1) of provisional application Ser. No. 60/175,613 filed on Jan. 11, 2000, the entirety of which is incorporated herein by reference.

BACKGROUND OF THE INVENTION

1. Technical Field

The present invention relates to the field of integrated circuit layout and design. More specifically, the present invention relates to a design process and structure for providing input/output components on an integrated circuit.

2. Description of the Related Art

The development of the technology for the fabrication and design of integrated circuits has allowed designers to place ever increasing functionality onto a smaller area of integrated circuits. This makes the surface area of an integrated circuit extremely valuable. A component of integrated circuits that occupies a relatively large area are the input/output (I/O) modules.

I/O Modules provide the attachment point for electrical bonding to the integrated circuit die. I/O modules generally consist of a bond pad, an electrostatic discharge protection device and I/O buffer circuitry. The core circuitry is generally composed of very small devices. These devices are fast and densely packed, but fragile. The I/O modules provide protection to the core circuitry as well as a connection point for getting signals on and off of the integrated circuit. Because they must provide this protection function, I/O modules use relatively large devices and occupy a disproportionate area on the integrated circuit die.

I/O modules are generally positioned on the periphery of the integrated circuit die. This makes the process of bonding to the bond pads easier and helps buffer the core circuitry from the physical stresses of cutting the die from the semiconductor wafer during manufacturing. The area occupied by the I/O modules is determined by the height (distance from the edge of the die to interior edge of the I/O modules) of the I/O modules. The remaining portion of the chip is available for core circuitry. Designers are always looking for ways to put more functionality onto an integrated circuit. Because of this, it is desirable to use the minimum area necessary for I/O modules to provide as much area as possible for the core circuitry.

BRIEF SUMMARY OF THE INVENTION

It is an object of the present invention to provide a structure and method allowing the positioning of integrated circuit elements efficiently.

It is a further object of the present invention to minimize the area necessary for the I/O periphery in an integrated circuit.

These and other objects are provided by a described embodiment of the present invention, which includes an integrated circuit having a plurality of I/O modules. The I/O modules include a bond pad formed on a substrate. The I/O modules also include an electrostatic discharge device formed in the substrate. The electrostatic discharge device is at least partially formed beneath the bond pad. The I/O module also includes an I/O buffer formed in the substrate. The I/O buffer is connected to the bond pad. The I/O buffer provides communication between the bond pad and circuitry formed in the substrate. The circuitry is positioned substantially adjacent to both the electrostatic discharge device and the I/O buffer.

BRIEF DESCRIPTION OF THE DRAWINGS

For a more complete understanding of the present invention and the advantages thereof, reference should be made to the following Detailed Description taken in connection with the accompanying drawings in which:

FIG. 4 is a layout diagram of an embodiment of the present invention;

FIG. 5 is a layout diagram another embodiment of the present invention in which a plurality of I/O modules positioned by a functional core;

FIG. 6 is a chart showing the die area recovered using the described embodiments of the present invention;

DETAILED DESCRIPTION OF THE PREFERRED EMBODIMENT

Figure 1:
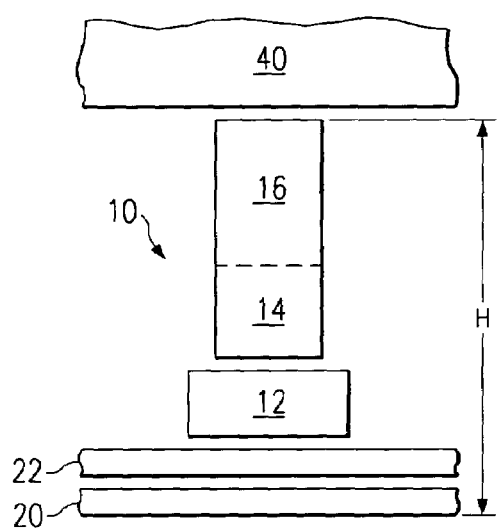
FIG. 1 is a layout diagram of a prior art I/O module.

FIG. 1 is a layout diagram of a prior art I/O module. I/O module 10 includes a bond pad 12, electrostatic discharge (ESD) device 14 and I/O buffer 16. Also included in FIG. 1 are scribe area 20 and scribe seal 22. Scribe area 20 provides space for the saw that separates a wafer into die. Scribe seal 22 is a physical buffer area between the dice and the scribe area. Scribe seal allows for the dissipation of physical stress during the dicing process.

The components of I/O module 10 are laid out in the conventional manner with the bond pad and the edge of the integrated circuit die and the I/O buffer 16 positioned between the functional core 40 and bond pad 12. I/O module 10 is an advanced module in that ESD device 14 is positioned beside bond pad 12.

Figure 2:
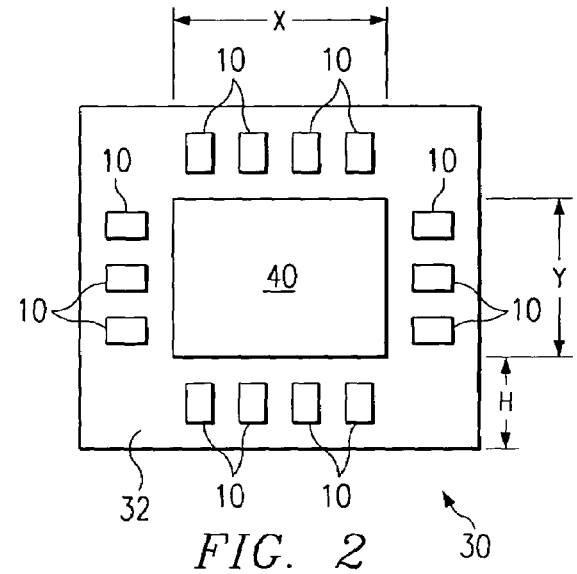
FIG. 2 is a layout diagram of the I/O module of FIG. 1 positioned on an integrated circuit die.

FIG. 2 is a layout diagram showing the position of I/O modules 10 on die 30 in I/O region 32. Functional core 40 is surrounded by I/O region 32. The overall size of the die 30 is determined by the width of core 40 (X) plus twice the height of the I/O modules 10 times the length of core 40 (Y) plus twice the height of the I/O modules 10. The formula for the area is $$Area=(X+2H)*(Y+2H)$$

which can be written as $$Area=XY+2HY+2HX+4H^2.$$

Figure 3:
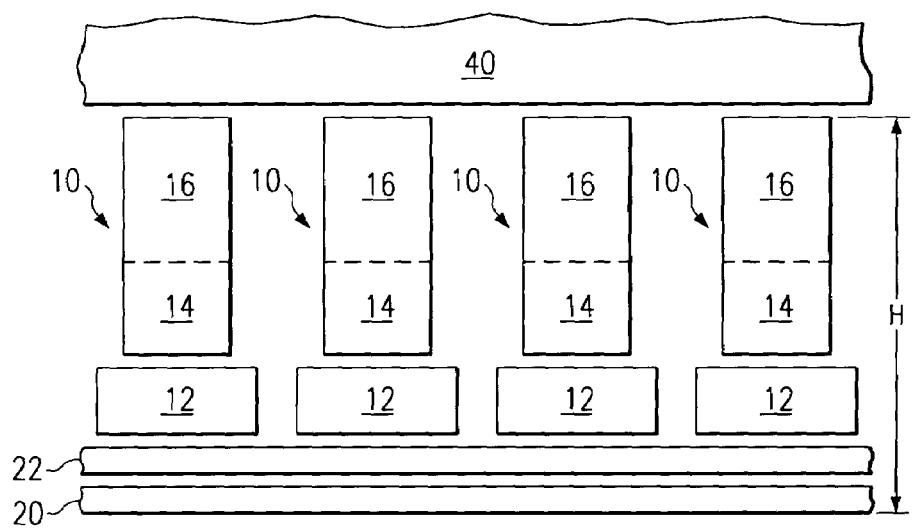
FIG. 3 is a layout diagram showing a plurality of prior art I/O modules positioned next to a functional core.

As can be seen from the above formula, the height of the I/O modules 10 has a large impact on the overall area of the die 30. Although FIG. 2 includes fourteen I/O modules 10, it is more common for an integrated circuit to include from 64 to 300 I/O modules. FIG. 3 is an enlarged portion of the layout of FIG. 2 showing four I/O modules 10 and their position relative to functional core 40.

FIG. 4 is a layout diagram of a novel I/O module 100, which is structured according to the teachings of the present invention. I/O module 100 is preferably formed on a crystalline semiconductor substrate. Bond pad 112 is positioned adjacent to scribe seal 122 as in the I/O module 10 of FIG. 1. Bond pad 112 is preferably formed of an aluminum composite layer, copper layer or gold clad copper layer having conductive upper surface for ball bonding. I/O buffer 116 is a similar I/O buffer circuit with a similar layout to that of I/O buffer 16. However, because I/O buffer 116 is positioned adjacent to scribe seal 122, the overall height Z of I/O module 100 is the height of I/O buffer 116 plus the width of scribe seal 122 and one half of scribe line 120.

In contrast, the height H of prior art I/O Module is height of I/O buffer 16 plus the height of ESD device 14 plus the width of scribe seal 22 and one half of scribe line 20. For example, the height of I/O buffer 16 may be $71\mu$, the height of ESD device 14 may be $21\mu$, the height of bond pad 12 may be $50\mu$ and the combined height of the scribe seal 22, scribe line 20 and additional spacing may be $46\mu$. This provides an overall height H of $188\mu$.

The inventive I/O module 100, however, provides a much smaller height Z using the same design rules. With the same dimensions for components of I/O module 10, I/O module 100 has a height of $81\mu$ for I/O module 116 plus $46\mu$ for scribe line 120 and scribe seal 122. By careful layout of I/O module 116, its height can be reduced to $74\mu$, thus providing an overall height Z of $120\mu$.

FIG. 5 shows I/O modules 100 as positioned adjacent to functional core 40. Functional core 40 may be any function capable of being implemented with integrated circuitry. For example, functional core 40 may comprise an application specific integrated circuit or a digital signal processor. Preferably, the circuitry of functional core 40 is fabricated using CMOS or BiCMOS processes. Because I/O modules 100 are wider than corresponding prior art modules, fewer I/O modules 100 can be provided for a given size of functional core 40. However, integrated circuit designs are rarely constrained by the number of I/O buffers. More often, the number of input/output connections is limited by the package. Packages that provide more that 200 connection points (for advanced ball grid arrays) can be cost prohibitive. Therefore, I/O modules 100 significantly reduce the die size for a given functionality without constraining the operational characteristics of the integrated circuit. Conversely, I/O modules 100 allow for a larger functional core for a given die size.

FIG. 6 is a chart comparing the die size and wasted area using the prior art I/O module. Six functional core sizes are listed. For each core size, a prior art I/O module with height H is listed and a corresponding novel module with the height Z is listed. Also listed is the total area using each module, the maximum number of I/O modules that can be placed on the die, the wasted area and the percentage of area wasted using the prior art. As can be seen from FIG. 6, the novel I/O module 100 reduces wasted space by 6%–13%, depending on functional core size.

Figure 7:
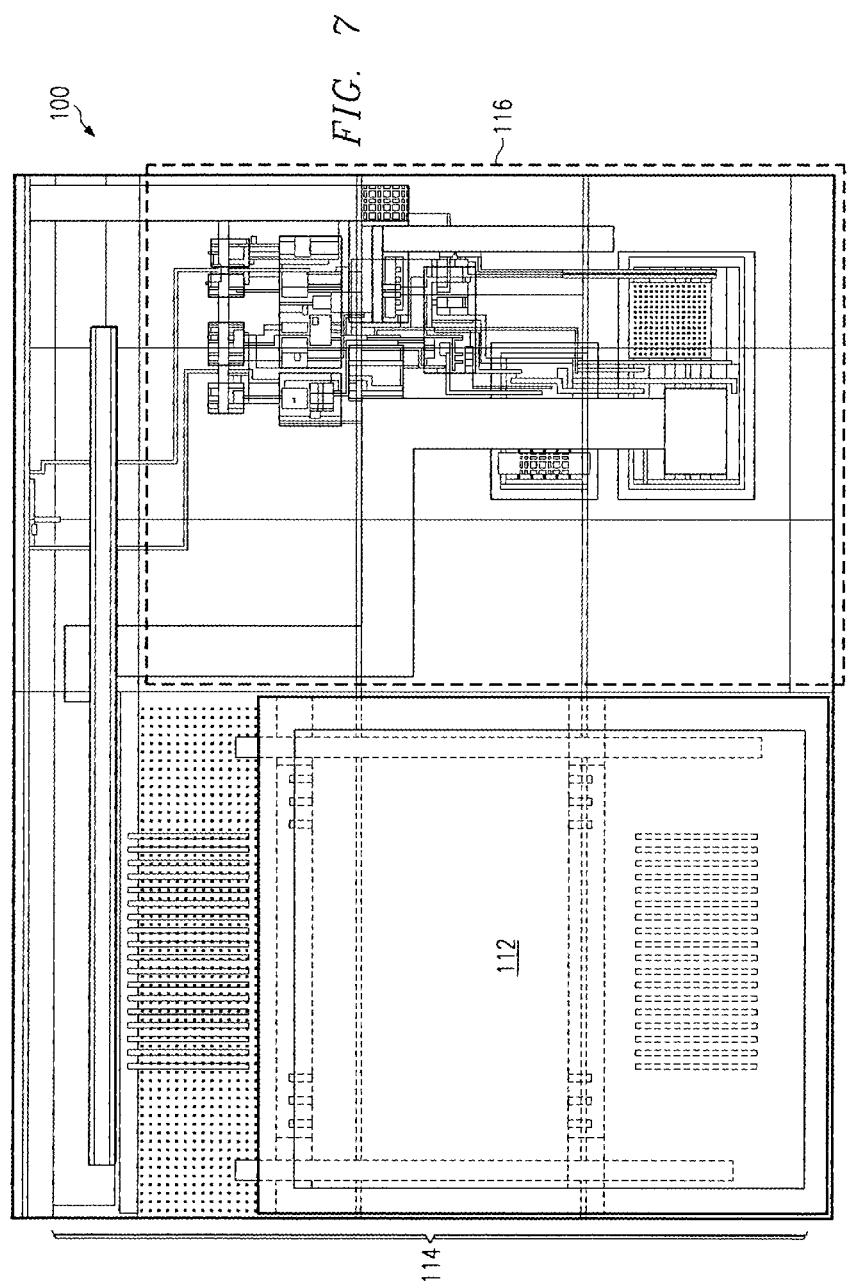
FIG. 7 is a detailed layout diagram of the embodiment of FIG. 4.

FIG. 7 is a layout diagram showing the specific topographical features of I/O module 100. ESD device 114 can be any number of electrostatic discharge devices. Examples of suitable devices can be found in Chen et al., U.S. Pat. No. 5,982,217, which is assigned to the assignee of this application and which is incorporated herein by reference.

Figure 8:
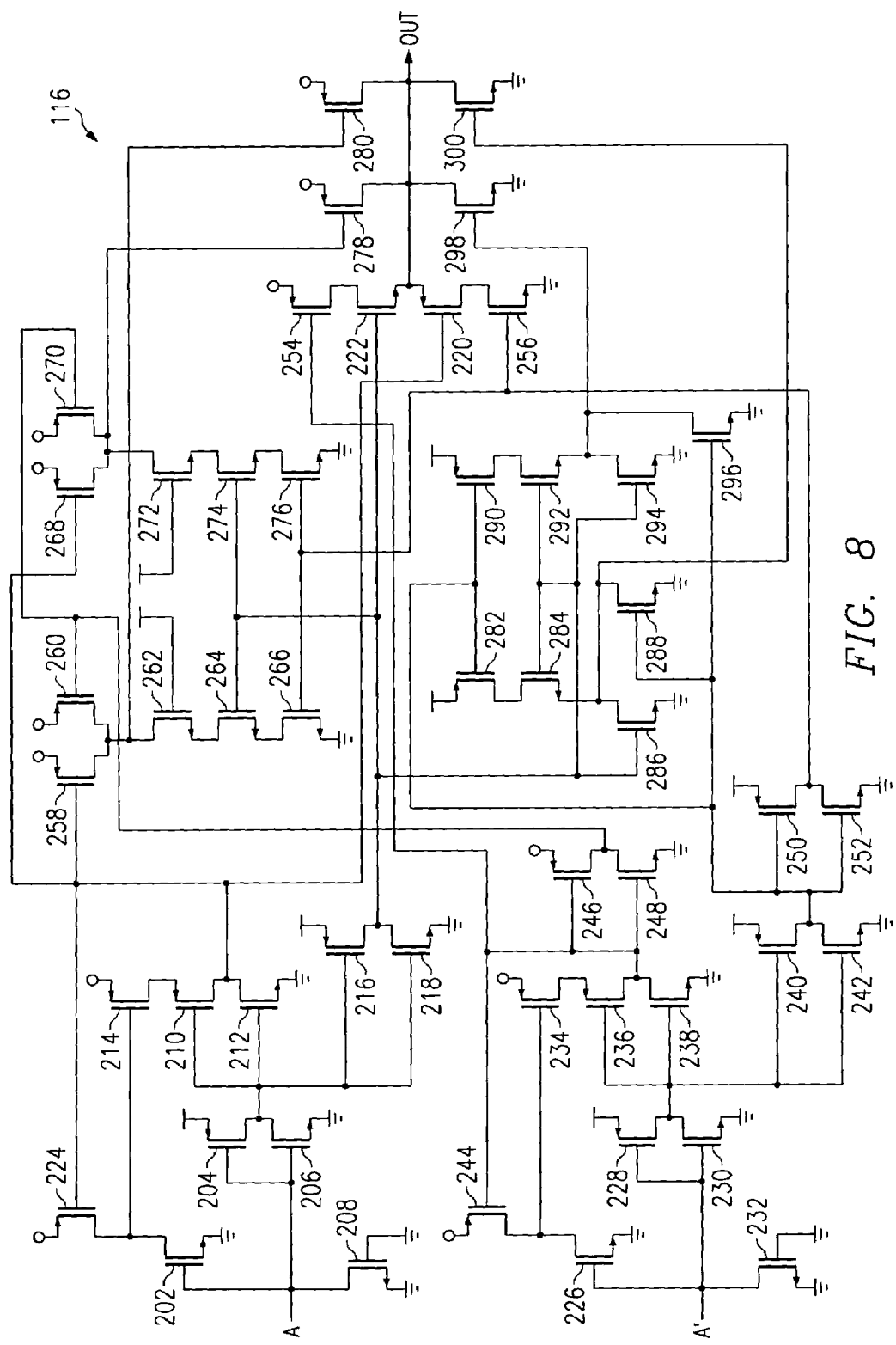
FIG. 8 is a schematic diagram of an output circuit suitable for used with the described embodiments of the present invention.

I/O buffer 116 can be any number of known designs for providing input and output drivers. An example is shown in FIG. 8. I/O buffer 116 is preferably fabricated using a multi-level metal system and a device fabrication process such as that shown in Smayling et al., U.S. Pat. No. 5,767,551, which is assigned to the assignee of this application and which is hereby incorporated by reference. I/O buffer 116 is a three stage, complementary output buffer designed for high speed and to provide a well conditioned output signal.

The input signal on input A of I/O buffer 116 is inverted by transistor 202 and a push-pull inverter formed by transistors 204 and 206. Transistor 208 prevents saturation of transistor 206 for high speed operation. The output from transistors 204 and 206 is inverted again by transistors 210 and 212 with a pull up (when appropriate) from transistor 214. The drain of transistor 214 is connected to the high $V_{DD}$ voltage supply (symbolized by a circle). The output from transistors 204 and 206 also drives the push-pull inverter formed by transistors 216 and 218. The output from transistors 210 and 212 drives the gate of drive transistor 220. The output from transistors 216 and 218 drives the gate of drive transistor 222. The output from transistors 210 and 212 also drives the gate of pull-up transistor 224.

The inverse of input A, A' is applied to the gates of transistors 226, 228 and 230. Transistors 226, 228, 230, 232, 234, 236, 238, 240, 242 and 244 provide the same functions as transistors 202, 204, 206, 208, 214, 210, 212, 216, 218, and 224, respectively. Additionally, transistors 245 and 248 invert and delay the output of transistors 236 and 238. In addition, transistors 250 and 252 invert and delay the output of transistors 240 and 242. The output of transistors 236 and 238 drives the gate of output transistor 254. The output of transistors 250 and 252 are used to drive the gate of output transistor 256.

Transistors 258, 260, 262, 264 and 266 constitute a pull down AND gate driving output transistor 278. Transistors 268, 270, 272, 274 and 276 constitute a pull-down AND gate driving output transistor 280. The pull-down portions of the gates are voltage limited by transistors 262 and 272 in that are gate strapped to $V_{DD}$ (the lower voltage supply symbolized by a horizontal line). This prevents saturation of transistors 278 and 280. The parallel pull-up transistors 258, 260, 268 and 270 provide rapid shut off of transistors 278 and 280. The gate inputs of transistors 258–270 are timed to provide staggered gate charging or draining capacity and to avoid race conditions where all transistors in a series are on.

Transistors 282–290 provide a complementary pull-up function for output transistors 298 and 300 to the function provided by transistors 258–270 for output transistors 278 and 280. In summary, transistors 220, 222, 254 and 256 provide rapid medium drive signals to begin and signal transition. Transistors 278, 280, 298 and 300 provide high capacity drive with gate drive signals that are carefully controlled. I/O buffer 116 in FIG. 8 is an output buffer of a certain preferred structure. However, the structure of FIG. 8 in no way limits the intended scope of the invention. The invention contemplates the use of any input or output buffer.

Although specific embodiments of the present invention are described herein, they are not to be construed as limiting the scope of the invention. For example, although specific circuits and device fabrication techniques are described and referred to herein, many specific devices and fabrication techniques may be advantageously used within the scope of the invention. Many embodiments of the invention will become apparent to those skilled in the art in light of the teachings of this specification. The scope of the invention is only limited by the claims appended hereto.

Having thus described my invention, what I claim as new and desire to secure by Letters Patent is set forth in the following claims.

What is claimed is:

1. An integrated circuit having a plurality of I/O modules, comprising:
   a semiconductor substrate having an interior core region and a peripheral region;
   a bond pad disposed on said substrate in said peripheral region;
   an electrostatic discharge device disposed in the substrate, the electrostatic discharge device being at least partially disposed beneath the bond pad;
   circuitry disposed in said substrate in said interior core region; and
   an I/O buffer disposed in the substrate in said peripheral region and connected to the bond pad for providing communication between the bond pad and said circuitry, said circuitry positioned substantially adjacent to both the electrostatic discharge device and the I/O buffer.

2. The integrated circuit of claim 1 wherein the substrate is a silicon substrate.

3. The integrated circuit of claim 1 wherein the I/O buffer is an output buffer.

4. The integrated circuit of claim 1 wherein the I/O buffer is an input buffer.

5. The integrated circuit of claim 1 wherein the I/O buffer is a complementary output buffer.

6. The integrated circuit of claim 1 wherein the circuitry is CMOS circuitry.

7. The integrated circuit of claim 1 wherein the circuitry is BiCMOS circuitry.

8. The integrated circuit of claim 1 wherein the circuitry is an application specific integrated circuit.

9. The integrated circuit of claim 1 wherein the circuitry is digital signal processor.

10. The integrated circuit of claim 1 wherein the entire surface of the substrate beneath the bond pad is occupied by the electrostatic discharge device.

* * * * *